(12) United States Patent  
Kitagawa et al.

(10) Patent No.: US 8,760,205 B2  
(45) Date of Patent: Jun. 24, 2014

(54) SEMICONDUCTOR DEVICE AND INPUT SIGNAL RECEPTION CIRCUIT

(71) Applicant: Elpida Memory, Inc., Tokyo (JP)

(72) Inventors: Katsuhiro Kitagawa, Tokyo (JP); Shotaro Kobayashi, Tokyo (JP)

(*) Notice: Subject to any disclaimer, the term of this patent is extended or adjusted under 35 U.S.C. 154(b) by 0 days.

(21) Appl. No.: 13/794,399

(22) Filed: Mar. 11, 2013

(65) Prior Publication Data

US 2013/0249613 A1  Sep. 26, 2013

(30) Foreign Application Priority Data

Mar. 23, 2012  (JP) ................................. 2012-067568

(51) Int. Cl.
*H03K 19/003*  (2006.01)

(52) U.S. Cl.
USPC .......................................................... 327/170

(58) Field of Classification Search
CPC .............. H03K 5/12; H03K 5/01; H03K 6/04
USPC ................................................. 327/134, 170
See application file for complete search history.

(56) References Cited

U.S. PATENT DOCUMENTS 6,091,277 A    7/2000  Fujii  
8,174,282 B2 *  5/2012  Fujii et al. ................ 324/762.01

FOREIGN PATENT DOCUMENTS

JP        11-202029 A    7/1999  
JP        2003-022698 A  1/2003

* cited by examiner

*Primary Examiner* — An Luu  
(74) *Attorney, Agent, or Firm* — Foley & Lardner LLP

(57) ABSTRACT

A semiconductor device according to the present invention includes an input circuit that is connected between an input node and an output node and that changes a level of the output node corresponding to a signal supplied to the input node, wherein when a control signal represents a first mode, a speed at which input circuit changes the level of the output node from a first level to a second level is greater than the speed at which input circuit changes the level of the output node from the second level to the first level and when the control signal represents a second mode, the speed at which input circuit changes the level of the output node from the second level to the first level is greater than the speed at which the input circuit changes the level of the output node from the first level to the second level.

12 Claims, 13 Drawing Sheets

SEMICONDUCTOR DEVICE AND INPUT SIGNAL RECEPTION CIRCUIT

BACKGROUND OF THE INVENTION

1. Field of the Invention

The present invention relates to a semiconductor device and an input signal reception circuit that receives an input signal.

2. Description of Related Art

In recent years, the speed at which signals have been input to semiconductor devices has increased and amplitudes of the input signals have decreased. At the speed at which signals are input into semiconductor devices has increased, and as the amplitudes of the input signals have decreased, an input signal reception circuit has been provided with a differential circuit that outputs a signal corresponding to the logic level of an input signal based on the difference between a reference voltage and the voltage of the input signal so as to receive an input signal and output a signal corresponding to the logic level of the input signal to a subsequent circuit (for example, refer to Patent Literature 1 (JP2003-22698A, Publication) and Patent Literature 2 (JP11-202029A, Publication)).

The foregoing differential circuit needs to have excellent signal output characteristics such that it can output a signal corresponding to the logic level of an input signal at a high speed and that it can output a signal with a large amplitude.

As shown in FIG. 3 of Patent Literature 1, a differential circuit has a current mirror circuit composed of a pair of transistors and a differential pair composed of a pair of transistors whose polarity is different from the polarity of transistor which make up of the current mirror circuit. The signal output characteristics of the differential circuit, in which the logic level of the input signal is the high level and in which the logic level of the input signal is the low level are different, for example, depending on whether the current mirror circuit or the differential pair is make up of P-type transistors.

Thus, some input signal reception circuits are provided with a first differential circuit where the signal output characteristics in which the logic level of the input signal is the high level are superior to those in which the logic level of the input signal is the low level and a second differential circuit where the signal output characteristics in which the logic level of the input signal is the low level are superior to those in which the logic level of the input signal is the high level so as to accurately receive the input signal whose logic level is the high level and the input signal whose logic level is the low level.

In the foregoing input signal reception circuit that is provided with two differential circuits, the two differential circuits are always kept in the active state such that non-periodic input signals are always received. Thus, the input signal reception circuit that is provided with two differential circuits has a problem in which power consumption increases. This problem becomes more pronounced as the number of differential circuits that are kept in the active state increases.

SUMMARY

A semiconductor device according to the present invention includes an input circuit that is connected between an input node and an output node and that changes the level of the output node corresponding to a signal supplied to the input node, wherein when a control signal represents a first mode, the speed at which the input circuit changes the level of the output node from a first level to a second level is greater than the speed at which the input circuit changes the level of the output node from the second level to the first level and when the control signal represents a second mode that is different from the first mode, the speed at which the input circuit changes the level of the output node from the second level to the first level is greater than the speed at which the input circuit changes the level of the output node from the first level to the second level.

The semiconductor device according to the present invention can prevent an increase of power consumption in such a manner that the speed at which the level of an output signal that is output from an input circuit is changed is varied corresponding to the control signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

With reference to the accompanying drawings, exemplary embodiments of the present invention will be described.

An input signal reception circuit according to the present invention is applied, for example, to a semiconductor device, and that receives an input signal from the outside of the semiconductor device and outputs a signal corresponding to the logic level of the input signal to a subsequent circuit.

First Exemplary Embodiment

Figure 1:
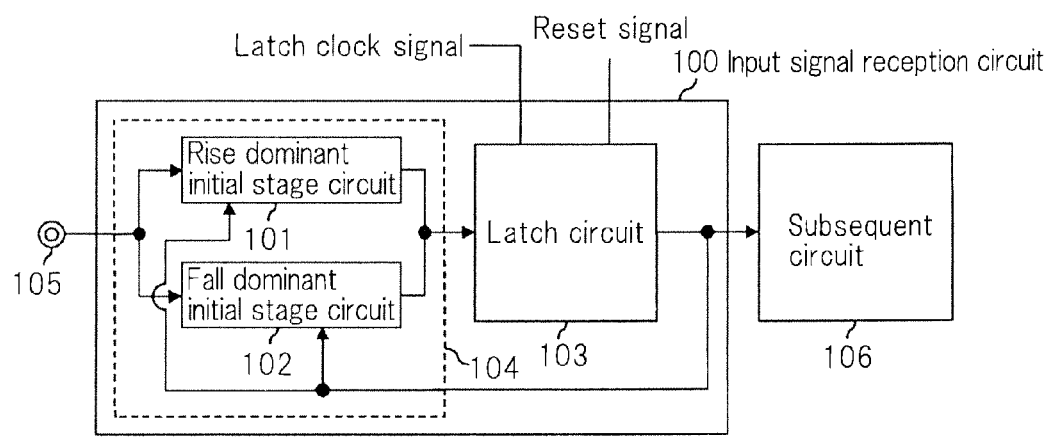
FIG. 1 is a block diagram showing the structure of an input signal reception circuit according to a first exemplary embodiment of the present invention.

FIG. 1 is a block diagram showing the structure of input signal reception circuit 100 according to a first exemplary embodiment of the present invention.

Input signal reception circuit 100 shown in FIG. 1 is composed of latch circuit 103 and input initial stage circuit 104.

Latch circuit 103 latches an output signal of input initial stage circuit 104 corresponding to a latch clock signal and outputs a latch output signal. In addition, latch circuit 103 outputs a latch output signal that is reset to a predetermined value corresponding to a reset signal.

Input initial stage circuit 104 is connected to input terminal 105. Input initial stage circuit 104 inputs an input signal. Input initial stage circuit 104 is controlled corresponding to the latch output signal. In addition, input initial stage circuit 104 has rise dominant initial stage circuit 101 that is a first differential circuit connected between input terminal 105 and a common node connected to the input of latch circuit 103 and that is controlled corresponding to the latch output signal; and fall dominant initial stage circuit 102 that is a second differential circuit connected between input terminal 105 and the common node connected to the input of latch circuit 103 and that is controlled corresponding to the latch output signal.

It is assumed that an input signal that has the high level as a first logic level corresponding to a first voltage value or an input signal that has the low level as a second logic level corresponding to a second voltage value that is lower than the first voltage value is input to input signal reception circuit 100 through input terminal 105.

Rise dominant initial stage circuit 101 is a differential circuit that outputs a signal in which the logic level of the input signal is inverted corresponding to the difference between the reference voltage and the voltage of the input signal. In rise dominant initial stage circuit 101, the signal output characteristics, in which the logic level of the input signal is the high level, are superior to those in which the logic level of the input signal is the low level. This means that rise dominant initial stage circuit 101 can output a signal at a higher speed and with a larger amplitude in which the logic level of the input signal is the high level than in which the logic level of the input signal is the low level.

Fall dominant initial stage circuit 102 is a differential circuit that outputs a signal in which the logic level of the input signal is inverted corresponding to the difference between the reference voltage and the voltage of the input signal. In fall dominant initial stage circuit 102, the signal output characteristics, in which the logic level of the input signal is the low level, are superior to those in which the logic level of the input signal is the high level. In the following description, the output signal of input initial stage circuit 104, namely, the output signal of rise dominant initial stage circuit 101 or fall dominant initial stage circuit 102, is referred to as the initial stage output signal.

Latch circuit 103 holds the logic level of the initial stage output signal that is input from input initial stage circuit 104 in synchronization with the latch clock signal and outputs the latch output signal having the same logic level as the initial stage output signal to rise dominant initial stage circuit 101, fall dominant initial stage circuit 102, and subsequent circuit 106. As will be described later, one of rise dominant initial stage circuit 101 or fall dominant initial stage circuit 102 enters the active state and the other enters the inactive state corresponding to the logic level of the latch output signal.

Next, with reference to FIG. 2, the structure of latch circuit 103 will be described.

Latch circuit 103 has inverters 201, 209, and 210; N-type transistors 202, and 206; P-type transistors 203 and 205; and NAND circuit 208.

The latch clock signal is input to the input node of inverter 201, the gate of P-type transistor 203, and the gate of N-type transistor 206. The reset signal is input to one input node of NAND circuit 208. During the normal operation, the logic level of the reset signal is the high level. When latch circuit 103 is reset, the logic level of the reset signal enters the low level.

Inverter 201 outputs a signal in which the logic level of the input latch clock signal is inverted to the gate of N-type transistor 202 and the gate of P-type transistor 205.

The signal in which the logic level of the latch clock signal is inverted is input to the gate of N-type transistor 202, whereas the latch clock signal is input to the gate of P-type transistor 203. Thus, N-type transistor 202 and P-type transistor 203 form transfer gate 204 located between input initial stage circuit 104 (not shown in FIG. 2) and the other input node of NAND circuit 208.

Likewise, the signal in which the logic level of the latch clock signal is inverted is input to the gate of P-type transistor 205, whereas the latch clock signal is input to the gate of N-type transistor 206. Thus, P-type transistor 205 and N-type transistor 206 form transfer gate 207 located between the output node of inverter 209 and the other input node of NAND circuit 208.

NAND circuit 208 outputs a latch output in which a signal that is input through transfer gate 204 or transfer gate 207 and the reset signal are NANDed to inverter 209 and inverter 210.

Inverter 209 outputs a signal in which the logic level of the latch output signal that is output from NAND circuit 208 is inverted to transfer gate 207. Inverter 210 outputs the latch output signal in which the logic level of the latch output that is output from NAND circuit 208 is inverted to rise dominant initial stage circuit 101, fall dominant initial stage circuit 102, and subsequent circuit 106 (they are not shown in FIG. 2).

Next, the operations of the individual sections of latch circuit 103 shown in FIG. 2 will be described.

First, the case in which the logic level of the latch clock signal is the low level will be described. In the following description, a signal that is input to the source of N-type transistor 202 and the source of P-type transistor 203 is referred to as the pre-latch signal. As described above, input initial stage circuit 104 is connected to transfer gate 204 such that the initial stage output signal is input to transfer gate 204. Thus, the logic level of the initial stage output signal is the same as that of the pre-latch signal.

While the logic level of the latch clock signal is the low level, inverter 201 outputs a signal whose logic level is the high level. The output signal of inverter 201 and the latch clock signal cause transfer gate 204 to enter the on state and transfer gate 207 to enter the off state. When transfer gate 204 enters the on state and transfer gate 207 enters the off state, the pre-latch signal whose logic level is the same as that of the initial stage output signal is input to NAND circuit 208.

As described above, rise dominant initial stage circuit 101 or fall dominant initial stage circuit 102 outputs the initial stage output signal in which the logic level of the input signal is inverted. Thus, when the logic level of the input signal is the high level, the logic level of the initial stage output signal (pre-latch signal) is the low level. During normal operation, the logic level of the reset signal is the high level. Thus, when the pre-latch signal whose logic level is the low level is input to NAND circuit 208, the logic level of the latch output that is output from NAND circuit 208 enters the high level. When the logic level of the latch output enters the high level, inverter 210 outputs the latch output signal whose logic level is the low level.

When the logic level of the input signal is the low level, the logic level of the initial stage output signal (pre-latch signal) enters the high level. During the normal operation, the logic level of the reset signal is the high level. Thus, when the pre-latch signal whose logic level is the high level is input to NAND circuit 208, the logic level of the latch output that is output from NAND circuit 208 enters the low level. When the logic level of the latch output enters the low level, inverter 210 outputs the latch output signal whose logic level is the high level.

Next, the case in which the logic level of the latch clock signal changes from the low level to the high level will be described.

When the logic level of the latch clock signal changes to the high level, inverter 201 outputs a signal whose logic level is the low level. The output signal of inverter 201 and the latch clock signal cause transfer gate 204 to enter the off state and transfer gate 207 to enter the on state. When transfer gate 204 enters the off state and transfer gate 207 enters the on state, a loop composed of NAND circuit 208 and inverter 209 is formed. The low level of the latch output corresponding to the latch clock signal whose logic level is the low level is held in the loop. The logic level latched by latch circuit 103 is referred to as the latch data.

Next, with reference to FIG. 3, the structure of rise dominant initial stage circuit 101 will be described.

Rise dominant initial stage circuit 101 has inverter 301; P-type transistors 302, 305, 308, and 309; and N-type transistors 303, 306, 310, 311, and 312.

The latch output signal that is output from latch circuit 103 is input to the input node of inverter 301, the gate of N-type transistor 303, the gate of P-type transistor 305, and the gate of N-type transistor 312.

Inverter 301 outputs a signal in which the logic level of the latch output signal is inverted to the gate of P-type transistor 302 and the gate of N-type transistor 306.

The signal in which the logic level of the latch output signal is inverted is input to the gate of P-type transistor 302, whereas the latch output signal is input to the gate of N-type transistor 303. Thus, P-type transistor 302 and N-type transistor 303 form transfer gate 304 located between the common node connected in common to the gate of P-type transistor 308 and the gate of P-type transistor 309 and the drain of P-type transistor 308.

Likewise, the latch output signal is input to the gate of P-type transistor 305, whereas the signal in which the logic level of the latch output signal is inverted is input to the gate of N-type transistor 306. Thus, P-type transistor 305 and N-type transistor 306 form transfer gate 307 located between power supply line VDD and the common node connected in common to the gate of P-type transistor 308 and the gate of P-type transistor 309.

The gate of P-type transistor 308 is connected to the common node, whereas the source of P-type transistor 308 is connected to power supply line VDD. The gate of P-type transistor 309 is connected to the common node; the source of P-type transistor 309 is connected to power supply line VDD, and the drain of P-type transistor 309 is connected output line Output.

The drain of N-type transistor 310 is connected to the drain of P-type transistor 308, whereas the gate of N-type transistor 310 is connected to reference voltage line Vref. The drain of N-type transistor 311 is connected to output line Output, whereas the gate of N-type transistor 311 is connected to input line Input. It is assumed that reference voltage Vref is input from a reference voltage generation circuit (not shown in FIG. 3) to reference voltage line Vref.

The latch output signal is input to the gate of N-type transistor 312; the source of N-type transistor 312 is connected to power supply line VSS that supplies the ground voltage; and the drain of N-type transistor 312 is connected in common to the drain of N-type transistor 310 and the drain of N-type transistor 311. N-type transistor 312 and P-type transistor 309 enters the off state corresponding to the latch output signal. Thus, the output signal of output line Output can be caused to float (high impedance state Hi-z) corresponding to the latch output signal regardless of the logic level of the input signal to N-type transistor 311. As a result, when rise dominant initial stage circuit 101 is in the inactive state, the operation of fall dominant initial stage circuit 102 connected to the same output line can be prevented from being disturbed.

Next, the operation of rise dominant initial stage circuit 101 will be described.

When the latch output signal whose logic level is the low level is input to rise dominant initial stage circuit 101, transfer gate 304 enters the off state and transfer gate 307 enters the on state.

When transfer gate 304 enters the off state and transfer gate 307 enters the on state, power supply line VDD is connected to the gate of P-type transistor 308 and the gate of P-type transistor 309 and thereby the power supply voltage (high level=VDD) is supplied to the gate of P-type transistor 308 and the gate of P-type transistor 309. Thus, P-type transistor 308 and P-type transistor 309 enter the off state. As a result, since both P-type transistor 309 located between N-type transistor 311 to which the input signal is input and power supply line VDD, and N-type transistor 312 located between N-type transistor 311 and power supply line VSS enter the off state, while output line Output is caused to float (high impedance state Hi-z), rise dominant initial stage circuit 101 can be caused to enter the inactive state regardless of the input signal of N-type transistor 311.

In contrast, when the latch output signal whose logic level is the high level is input to rise dominant initial stage circuit 101, transfer gate 304 enters the on state; transfer gate 307 enters the off state; and N-type transistor 312 enters the on state. When transfer gate 304 enters the on state, transfer gate 307 enters the off state, and N-type transistor 312 enters the on state, then rise dominant initial stage circuit 101 enters the active state.

While rise dominant initial stage circuit 101 is in the active state, rise dominant initial stage circuit 101 determines the logic level of the input signal corresponding to the difference between the voltage of the input signal that is input to N-type transistor 311 and reference voltage Vref that is input to N-type transistor 310. If rise dominant initial stage circuit 101 determines that the logic level of the input signal is the high level, rise dominant initial stage circuit 101 outputs a signal whose logic level is the low level through output line Output. In contrast, if rise dominant initial stage circuit 101 determines that the logic level of the input signal is the low level, rise dominant initial stage circuit 101 outputs a signal whose logic level is the high level.

As described above, in rise dominant initial stage circuit 101, the signal output characteristics in which the logic level of the input signal is the high level are superior to those in which the logic level of the input signal is the low level. Next, with referenced to FIG. 4, this reason will be described.

Figure 3:
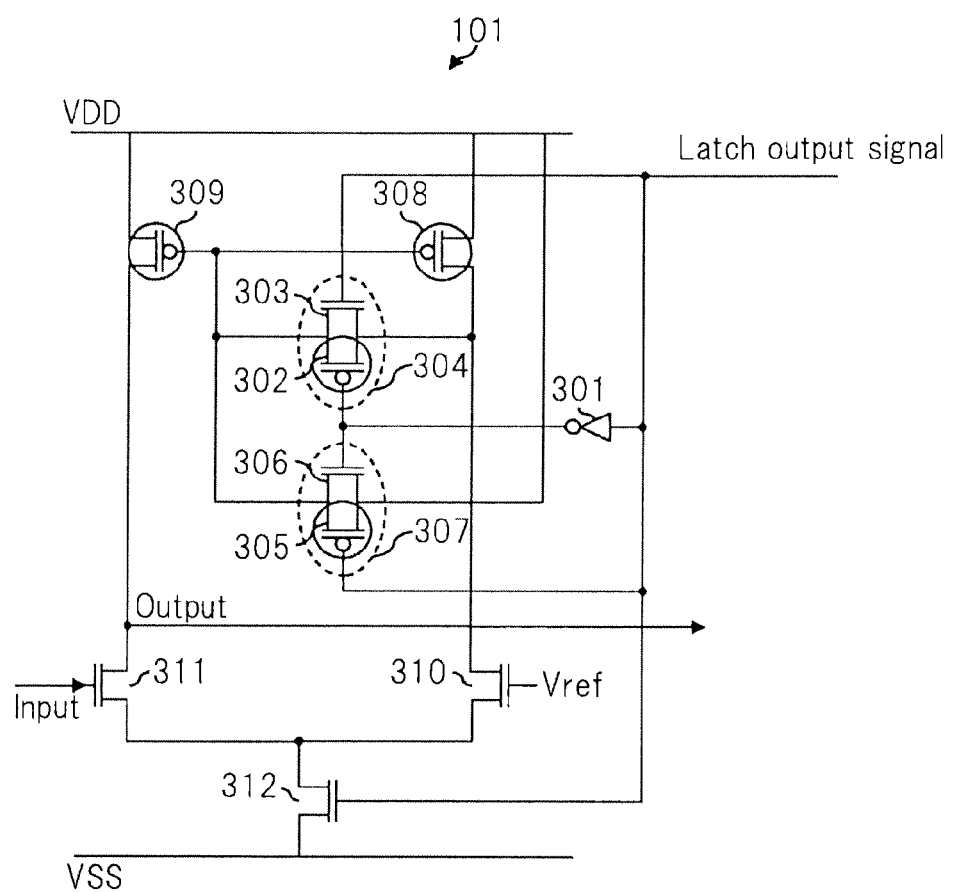
FIG. 3 is a circuit diagram showing the structure of a rise dominant initial stage circuit.
Figure 4:
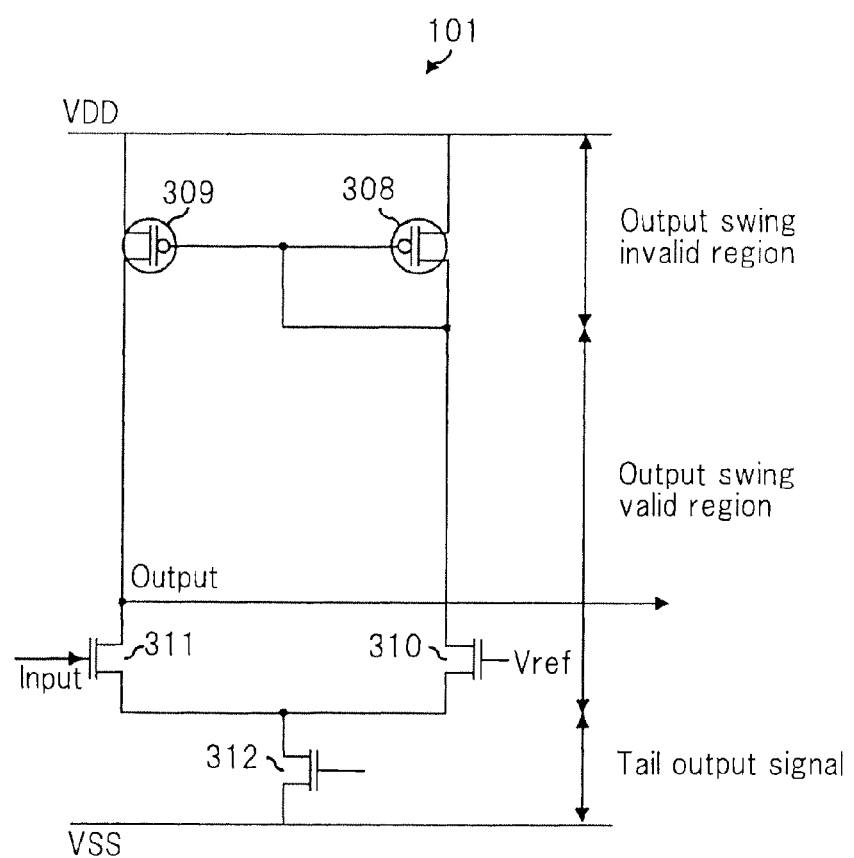
FIG. 4 is a schematic diagram describing the operation of the rise dominant initial stage circuit shown in FIG. 3.

FIG. 4 is a schematic diagram showing a structure that outputs a signal to output line Output. This structure is extracted from rise dominant initial stage circuit 101 shown in FIG. 3. Specifically, in FIG. 4, inverter 301 is not shown. In addition, since transfer gate 304 is in the on state, transfer gate 304 is not shown. The gate of P-type transistor 308, the gate of P-type transistor 309, and the drain of P-type transistor 308 are directly connected. Moreover, in FIG. 4, since transfer gate 307 is in the off state, transfer gate 307 is not shown.

When the input signal whose logic level is the high level is input to rise dominant initial stage circuit 101, N-type transistor 311 enters the on state and thereby electric charges can be drawn from output line Output through N-type transistor 311 and N-type transistor 312 that is in the on state. Thus, the level of output line Output can be substantially varied corresponding to the electric charge drawing competence of N-type transistor 311.

In contrast, when the input signal whose logic level is the low level is input to rise dominant initial stage circuit 101, N-type transistor 311 enters the off state and thereby P-type transistor 309 charges output line Output. Since the current that flows in P-type transistor 309 depends on N-type transistor 310 (namely, reference voltage Vref), it takes a time to charge output line Output. Thus, in rise dominant initial stage circuit 101, the signal output time in the case in which the logic level of the input signal is the low level is longer than that in the case in which the logic level of the input signal is the high level.

In addition, when the logic level of the input signal is the low level, since the voltage that is input to the gate of P-type transistor 309 depends on N-type transistor 310 and P-type transistor 308, the on state of P-type transistor 309 is restricted. Thus, the amplitude swing of the signal that is output from rise dominant initial stage circuit 101 occurs only between the tail voltage applied to N-type transistor 312 (a voltage that floats due to the on resistance of N-type transistor 312 from ground voltage VSS) and a predetermined voltage lower than power supply voltage VDD (a voltage that becomes lower due to the on resistance of P-type transistor 309 from power supply voltage VDD). In other words, in rise dominant initial stage circuit 101, when the logic level of the input signal is the low level, an output swing invalid region in which the full amplitude swing of the signal does not occur on the power supply voltage VDD side occurs. In contrast, in rise dominant initial stage circuit 101, when the logic level of the input signal is the high level, since the full amplitude swing of the signal occurs on the ground voltage VSS side (up to the tail voltage), the output swing invalid region does not substantially occur.

Thus, rise dominant initial stage circuit 101 can output a signal at a higher speed and with a larger amplitude when the logic level of the input signal is the high level than when the logic level of the input signal is the low level. Thus, in rise dominant initial stage circuit 101, the signal output characteristics, in which the logic level of the input signal is the high level, are superior to those in which the logic level of the input signal is the low level.

Figure 5:
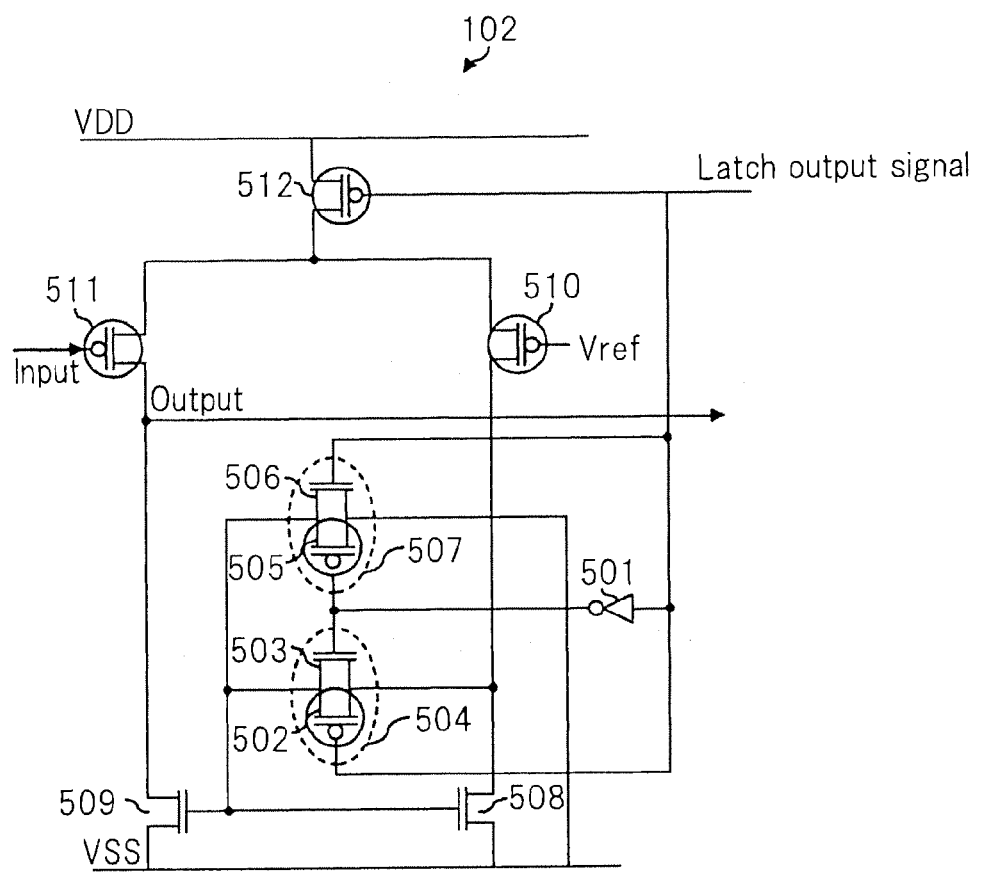
FIG. 5 is a circuit diagram showing the structure of a fall dominant initial stage circuit shown in FIG. 1.

Next, with reference to FIG. 5, the structure of fall dominant initial stage circuit 102 will be described.

Fall dominant initial stage circuit 102 has inverter 501; P-type transistors 502, 505, 510, 511, and 512; and N-type transistors 503, 506, 508, and 509.

The latch output signal that is output from latch circuit 103 is input to the input node of inverter 501, the gate of P-type transistor 502, the gate of N-type transistor 506, and the gate of P-type transistor 512.

Inverter 501 outputs the signal in which the logic level of the input latch output signal is inverted to the gate of N-type transistor 503 and the gate of P-type transistor 505. The latch output signal is input to the gate of P-type transistor 502, whereas the signal in which the logic level of the latch output signal is inverted is input to the gate of N-type transistor 503. Thus, P-type transistor 502 and N-type transistor 503 form transfer gate 504 that is connected to the drain of N-type transistor 508 and the common node connected in common to the gate of N-type transistor 508 and the gate of N-type transistor 509.

Likewise, the signal in which the logic level of the latch output signal is inverted is input to the gate of P-type transistor 505, whereas the latch output signal is input to the gate of N-type transistor 506. Thus, P-type transistor 505 and N-type transistor 506 form transfer gate 507 that is connected to power supply line VSS and the common node connected in common to the gate of N-type transistor 508 and the gate of N-type transistor 509.

The gate of N-type transistor 508 is connected to the common node, whereas the source of N-type transistor 508 is connected to power supply line VSS. The gate of N-type transistor 509 is connected to the common node; the source of N-type transistor 509 is connected to power supply line VSS; and the drain of N-type transistor 509 is connected to output line Output.

The drain of P-type transistor 510 is connected to the drain of N-type transistor 508, whereas the gate of P-type transistor 510 is connected to reference voltage line Vref. The drain of P-type transistor 511 is connected to output line Output, whereas the gate of P-type transistor 511 is connected to input line Input.

The latch output signal is input to the gate of P-type transistor 512; the source of P-type transistor 512 is connected to power supply line VDD; and the drain of P-type transistor 512 is connected in common to the drain of P-type transistor 510 and the drain of P-type transistor 511. P-type transistor 512 and N-type transistor 509 enter the off state corresponding to the latch output signal. Thus, the output signal of output line Output can be caused to float (high impedance state Hi-z) corresponding to the latch output signal regardless of the logic level of the input signal to N-type transistor 509. As a result, when fall dominant initial stage circuit 102 is in the inactive state, the operation of rise dominant initial stage circuit 101 connected to the same output line Output can be prevented from being disturbed.

Next, the operation of fall dominant initial stage circuit 102 will be described.

When the latch output signal whose logic level is the high level is input to fall dominant initial stage circuit 102, transfer gate 504 enters the off state, transfer gate 507 enters the on state, and P-type transistor 512 enters the off state.

When transfer gate 504 enters the off state and transfer gate 507 enters the on state, then power supply line VSS is connected to the gate of N-type transistor 508 and the gate of N-type transistor 509 and thereby the ground voltage (low level=VSS) is supplied to the gates of N-type transistor 508 and N-type transistor 509. Thus, N-type transistor 508 and N-type transistor 509 enter the off state. As a result, both P-type transistor 512 located between P-type transistor 511 to which the input signal is input and power supply line VDD and N-type transistor 509 located between P-type transistor 511 and power supply line VSS enter the off state. Thus, while output line Output is caused to float (high impedance state Hi-z), fall dominant initial stage circuit 102 can be caused to enter the inactive state regardless of the input signal of P-type transistor 511.

In contrast, when the latch output signal whose logic level is the low level is input to fall dominant initial stage circuit 102, then transfer gate 504 enters the on state, transfer gate 507 enters the off state, and P-type transistor 512 enters the on state. When transfer gate 504 enters the on state, transfer gate 507 enters the off state, and P-type transistor 512 enters the on state, then fall dominant initial stage circuit 102 enters the active state.

While fall dominant initial stage circuit 102 is in the active state, fall dominant initial stage circuit 102 determines the logic level of the input signal corresponding to the difference between the voltage of the input signal that is input to P-type transistor 511 and reference voltage Vref that is input to P-type transistor 510. If fall dominant initial stage circuit 102 determines that the logic level of the input signal is the high level, fall dominant initial stage circuit 102 outputs the signal whose logic level is the low level through output line Output. In contrast, if fall dominant initial stage circuit 102 determines that the logic level of the input signal is the low level, fall dominant initial stage circuit 102 outputs the signal whose logic level is the high level.

As described above, in fall dominant initial stage circuit 102, the signal output characteristics, in which the logic level of the input signal is the low level, are superior to those in which the logic level of the input signal is the high level. Next, with reference to FIG. 6, this reason will be described.

Figure 6:
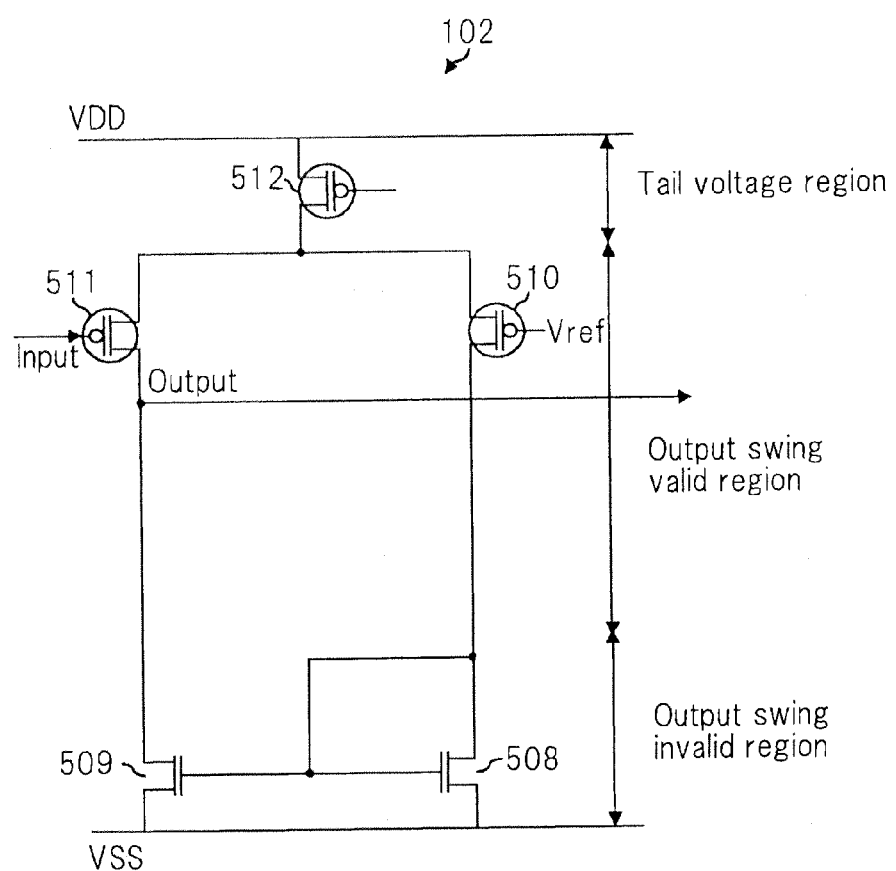
FIG. 6 is a schematic diagram describing the operation of the fall dominant initial stage circuit shown in FIG. 5.

FIG. 6 is schematic diagram showing a structure that outputs a signal to output line Output. This structure is extracted from fall dominant initial stage circuit 102 shown in FIG. 5. Specifically, in FIG. 6, inverter 501 is not shown. In addition, since transfer gate 504 is in the on state, transfer gate 504 is not shown. The gate of N-type transistor 508, the gate of N-type transistor 509, and the drain of N-type transistor 508 are directly connected. Moreover, in FIG. 6, since transfer gate 507 is in the off state, transfer gate 507 is not shown.

When the input signal whose logic level is the low level is input to fall dominant initial stage circuit 102, then P-type transistor 511 enters the on state and thereby output line Output can be charged through P-type transistor 511 and P-type transistor 512 that is in the on state. Thus, the level of output line Output can be substantially varied corresponding to the charging competent (current drive competent) of P-type transistor 511.

In contrast, when the input signal whose logic level is the high level is input to fall dominant initial stage circuit 102, P-type transistor 511 enters the off state and thereby N-type transistor 509 draws electric charges from output line Output. Since the current that flows in N-type transistor 509 depends on P-type transistor 510 (namely, reference voltage Vref), it takes time to draw electric charges from output line Output. Thus, in fall dominant initial stage circuit 102, the signal output time in the case in which the logic level of the input signal is the high level is longer than that in the case in which the logic level of the input signal is the low level.

In addition, when the logic level of the input signal is the high level, the voltage that is input to the gate of N-type transistor 509 depends on P-type transistor 510 and N-type transistor 508. Thus, the amplitude swing of the signal that is output from fall dominant initial stage circuit 102 occurs only between the tail voltage applied to P-type transistor 512 (a voltage that becomes lower due to the on resistance of P-type transistor 512 from VDD) and a predetermined voltage higher than power supply voltage VSS (a voltage that floats corresponding to the on resistance of N-type transistor 509 from ground voltage VSS). In other words, in fall dominant initial stage circuit 102, when the logic level of the input signal is the high level, an output swing invalid region in which the full amplitude swing of the signal does not occur on the power supply voltage VSS side occurs. In contrast, in fall dominant initial stage circuit 102, when the logic level of the input signal is the low level, since the full amplitude swing of the signal occurs on the power supply voltage VDD side (up to the tail voltage), the output swing invalid region does not substantially occur.

Thus, fall dominant initial stage circuit 102 can output a signal at a higher speed and with a larger amplitude when the logic level of the input signal is the low level than when the logic level of the input signal is the high level. Thus, in fall dominant initial stage circuit 102, the signal output characteristics, in which the logic level of the input signal is the low level, are superior to those in which the logic level of the input signal is the high level.

Next, the operations of rise dominant initial stage circuit 101, fall dominant initial stage circuit 102, and latch circuit 103 will be specifically described.

In the following description, it is assumed that in the initial state, an input signal whose logic level is the high level is input to input initial stage circuit 104.

When the input signal whose logic level is the high level is input to input initial stage circuit 104, input initial stage circuit 104 outputs an initial stage output signal whose logic level is the low level to latch circuit 103. In the initial state, a technique in which one of rise dominant initial stage circuit 101 or fall dominant initial stage circuit 102 that make up input initial stage circuit 104 is caused to enter the active state will be described later.

As described above, since the logic level of the pre-latch signal is the same as the logic level of the initial stage output signal, the logic level of the pre-latch signal is the low level. Assuming that the logic level of the latch clock signal is the low level, transfer gate 204 enters the on state and thereby the signal whose logic level is the low level is input to one node of NAND circuit 208. Moreover, in the initial state, the logic level of the reset signal enters the low level so as to reset latch circuit 103.

When a signal whose logic level is the low level is input to one node of NAND circuit 208 and the reset signal whose logic level is the low level is input to the other node of NAND circuit 208, then the logic level of the latch output enters the high level. When the logic level of the latch output enters the high level, since the logic level of the latch output signal that is output from inverter 210 enters the low level, rise dominant initial stage circuit 101 enters the inactive state and fall dominant initial stage circuit 102 enters the active state.

When the logic level of the latch output enters the high level, since the logic level of the latch clock signal that is output from inverter 209 enters the high level, latch data whose logic level is the low level is held in the loop composed of NAND circuit 208 and inverter 209.

Next, it is assumed that an input signal whose logic level is the high level is followed by an input signal whose logic level is the low level.

As described above, since fall dominant initial stage circuit 102 is in the active state, fall dominant initial stage circuit 102 outputs the initial stage output signal in which the logic level of the input signal is inverted, namely whose logic level is the high level.

In fall dominant initial stage circuit 102, the signal output characteristics, in which the logic level of the input signal is the low level, are superior to those in which the logic level of the input signal is the high level. Thus, when fall dominant initial stage circuit 102 enters the active state, it can output the initial stage output signal at a higher speed and with a larger amplitude than when rise dominant initial stage circuit 101 enters the active state.

Next, it is assumed that an input signal whose logic level is the high level is followed by an input signal whose logic level is the high level.

As described above, since fall dominant initial stage circuit 102 is in the active state, fall dominant initial stage circuit 102 outputs the initial stage output signal in which the logic level of the input signal is inverted. In this case, the logic levels of the initial stage output signal, the pre-latch signal, the latch output, the latch data, and the latch output signal are the same as those of the signals that have been input last time. Thus, the initial stage circuit does not need to output a signal with a high speed response.

In the foregoing, the case in which an input signal whose logic level is the high level is followed by an input signal whose logic level is the low level and the case in which an input signal whose logic level is the high level is followed by an input signal whose logic level is the high level were described. In these cases, fall dominant initial stage circuit 102 became the active state.

By contrast, in the initial state, when an input signal whose logic level is the low level is input, the logic level of the latch output signal enters the high level. When the logic level of the latch output signal enters the high level, rise dominant initial stage circuit 101 enters the active state.

Since rise dominant initial stage circuit 101 is in the active state, when an input signal whose logic level is the low level is followed by an input signal whose logic level is the high level, rise dominant initial stage circuit 101 outputs a signal. As described above, in rise dominant initial stage circuit 101, the signal output characteristics, in which the logic level of the input signal is the high level, are superior to those in which the logic level of the input signal is the low level. Thus, rise dominant initial stage circuit 101 enters the active state, it can output a signal at a higher speed and with a larger amplitude than when fall dominant initial stage circuit 102 enters the active state.

In contrast, when an input signal whose logic level is the low level is followed by an input signal whose logic level is the low level, the logic levels of the pre-latch signal, the latch output, the latch data, and the latch output signal are the same as those of the signals that have been input last time. Thus, the initial stage circuit does not need to output a signal with high speed response.

Thus, according to this embodiment, input signal reception circuit 100 causes only rise dominant initial stage circuit 101 or fall dominant initial stage circuit 102 to enter the active state as a differential circuit that has excellent output characteristics for an input signal that is input next time corresponding to the logic level of the input signal that has been input last time and causes the other circuit to enter the inactive state.

Thus, input signal reception circuit 100 can accurately receive an input signal. In addition, since input signal reception circuit 100 causes only rise dominant initial stage circuit 101 or fall dominant initial stage circuit 102 to enter the active state, input signal reception circuit 100 can reduce power consumption in comparison with the input signal reception circuit that causes two differential circuits that differ in signal output characteristics to be always in the active state corresponding to the logic level of the input signal.

Figure 12:
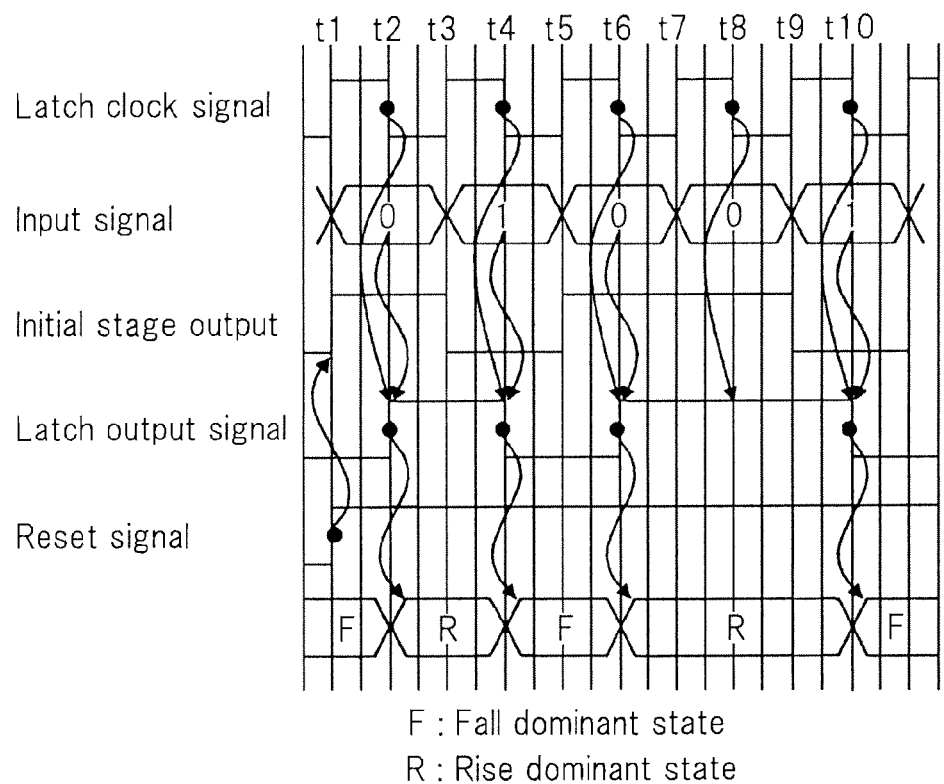
FIG. 12 is a timing chart showing the operation of the input signal reception circuit shown in FIG. 1.

The specific operation of input signal reception circuit 100 is shown in FIG. 12.

At time t1, the reset signal is deactivated and thereby the logic level of the initial stage output enters the high level. At this time, since the logic level of the latch output signal is the low level, in input initial stage circuit 104, fall dominant initial stage circuit 102 enters the active state and rise dominant initial stage circuit 101 enters the inactive state and thereby the fall dominant state occurs.

At time t2, the initial stage output whose logic level is changed to the high level is latched by latch circuit 103 corresponding to the input signal (0) whose logic level is the low level at a fall edge of the latch clock signal and thereby the logic level of the latch output signal enters the high level. When the logic level of the latch output signal enters the high level, in input initial stage circuit 104, fall dominant initial stage circuit 102 enters the inactive state and rise dominant initial stage circuit 101 enters the active state and thereby the rise dominant state occurs. At time t3 or later, the initial stage output that is changed corresponding to the logic level of the input signal is latched by latch circuit 103 at a fall edge of the latch clock signal and thereby a switching operation between the fall dominant state and the rise dominant state is repeated.

Second Exemplary Embodiment

Figure 7:
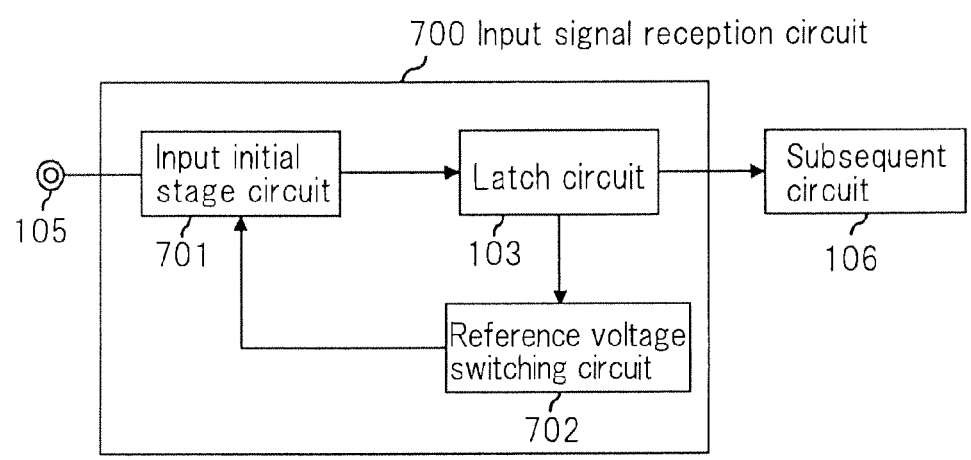
FIG. 7 is a block diagram showing the structure of an input signal reception circuit according to a second exemplary embodiment of the present invention.

FIG. 7 is a block diagram showing the structure of input signal reception circuit 700 according to a second exemplary embodiment of the present invention. In FIG. 7, similar structural members to those in FIG. 1 are denoted by similar reference numerals and their description will be omitted.

Input signal reception circuit 700 is different from input signal reception circuit 100 in that input initial stage circuit 104 is replaced with input initial stage circuit 701, in that reference voltage switching circuit 702 is added, and in that the latch output signal is output from latch circuit 103 to reference voltage switching circuit 702 instead of input initial stage circuit 104.

Input initial stage circuit 701 is a differential circuit that outputs a signal in which the logic level of an input signal is inverted corresponding to the difference between the voltage of the input signal that is input through input terminal 105 and a reference voltage.

Reference voltage switching circuit 702 outputs reference voltage Vref that is one of two voltages supplied from a reference voltage generation circuit (not shown in FIG. 7) to input initial state circuit 701 corresponding to a latch output signal that is input from latch circuit 103.

Figure 8:
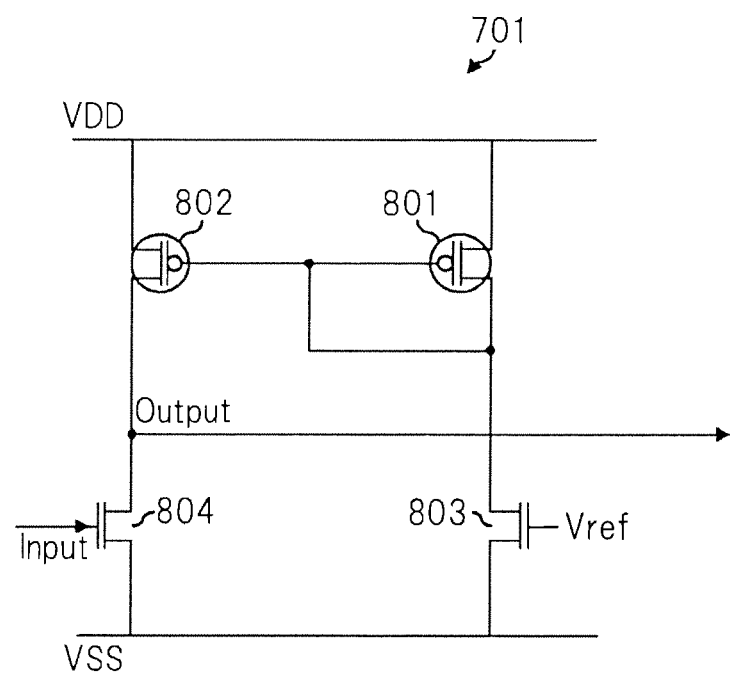
FIG. 8 is a circuit diagram showing the structure of an input initial stage circuit shown in FIG. 7.

Next, with reference to FIG. 8, the structure of input initial stage circuit 701 will be described.

Input initial stage circuit 701 has P-type transistors 801 and 802; and N-type transistors 803 and 804.

Input initial stage circuit 701 is different from rise dominant initial stage circuit 101 shown in FIG. 3 in that inverter 301, transfer gates 304 and 307, and N-type transistor 312 are omitted from rise dominant initial stage circuit 101.

P-type transistor 801 corresponds to P-type transistor 308; P-type transistor 802 corresponds to P-type transistor 309; N-type transistor 803 corresponds to N-type transistor 310; and N-type transistor 311 corresponds to N-type transistor 804. The interconnections among P-type transistors 801 and 802 and N-type transistors 803 and 804 are the same as those among P-type transistors 308 and 309 and N-type transistors 310 and 311 shown in FIG. 4. However, in input initial stage circuit 701, since N-type transistor 312 is removed, power supply line VSS is directly connected to the source of N-type transistor 803 and the source of N-type transistor 804.

Since input initial stage circuit 701 has a structure just corresponding to rise dominant initial stage circuit 101, the circuit scale of input initial stage circuit 701 is smaller than that of input initial stage circuit 104.

Alternatively, input initial stage circuit 701 may have the same structure as fall dominant initial stage circuit 102 in which inverter 501, transfer gates 504 and 507, and P-type transistor 512 are removed from fall dominant initial stage circuit 102. In this case, the sources of two P-type transistors that form a differential pair and power supply line VDD are directly connected.

Alternatively, in input initial stage circuit 701, a transistor may be located between transistors that form a differential pair and power supply line VSS (if the differential pair is composed of P-type transistors, a transistor may be located between transistors that form the differential pair and power supply line VDD). The transistor located between the sources of transistors that form the differential pair and power supply line VDD or power supply line VSS depends on the type of the circuit connected to the subsequent stage of output line Output. Since the transistor located between the sources of the transistors that form the differential pair and power supply line VDD or power supply line VSS causes the output signal of output line Output to float, if the output signal of output line Output needs to float (high impedance state Hi-z), the transistor may be located between the sources of the transistors that form the differential pair and power supply line VDD or power supply line VSS.

When rise dominant initial stage circuit 101 or fall dominant initial stage circuit 102 is in the active state, since the output of the other needs to float such that the dominant initial stage circuit that is in the active state is not affected by the other dominant initial stage circuit, the transistor is located between the sources of the transistors that forms the differential pair and power supply line VDD or power supply line VSS. However, if one dominant initial stage circuit that is in the active state is not affected by the other dominant initial stage circuit, the transistor may not located between the sources of the transistors that form the differential pair and power supply line VDD or power supply line VSS. If the transistor is not located between the sources of the transistors that form the differential pair and power supply line VDD or power supply line VSS, no tail voltage occurs and thereby the output swing valid region can be increased.

Figure 9:
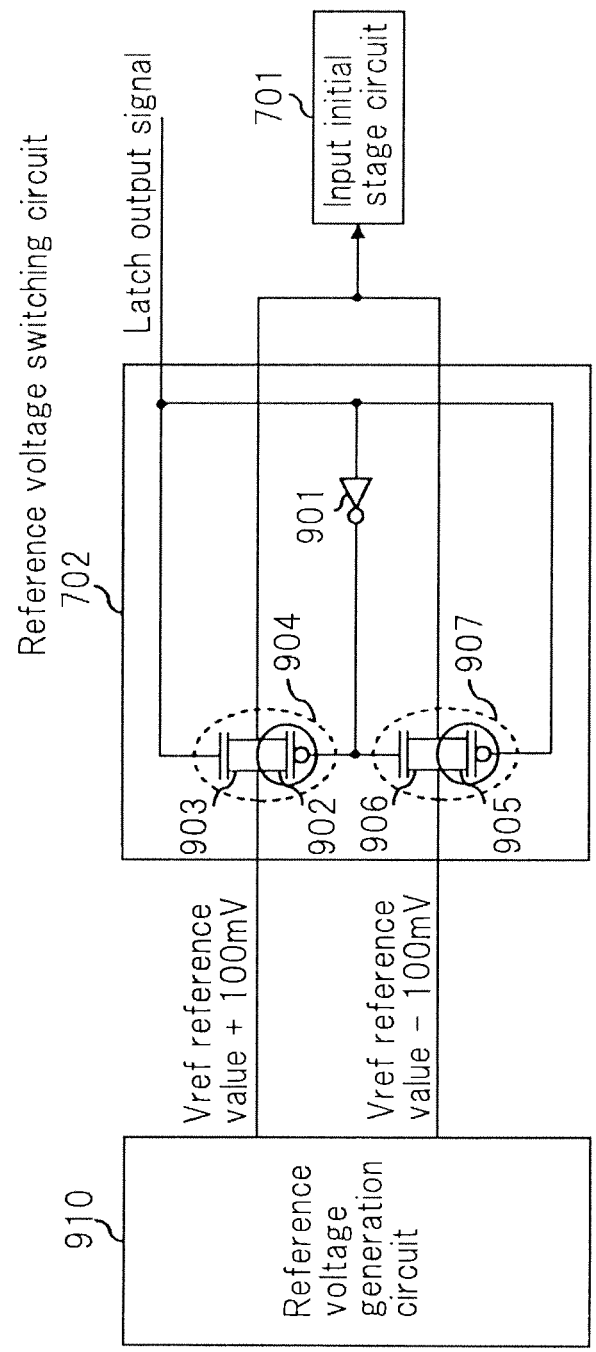
FIG. 9 is a circuit diagram showing the structure of a reference voltage switching circuit shown in FIG. 7.

Next, with reference to FIG. 9, the structure of reference voltage switching circuit 702 will be described.

Reference voltage switching circuit 702 has inverter 901; P-type transistor 902 and 905; and N-type transistor 903 and 906.

A latch output signal that is output from latch circuit 103 is input to the input node of inverter 901, the gate of N-type transistor 903, and the gate of P-type transistor 509.

Inverter 901 outputs a signal in which the logic level of the input latch output signal is inverted to the gate of P-type transistor 902 and the gate of N-type transistor 906. Thus, the signal in which the logic level of the latch output signal is inverted is input to the gate of P-type transistor 902, whereas the latch output signal is input to the gate of N-type transistor 903. Thus, P-type transistor 902 and N-type transistor 903 form transfer gate 904 located between reference voltage generation circuit 910 and input initial stage circuit 701.

Likewise, the latch output signal is input to the gate of P-type transistor 905, whereas the signal in which the logic level of the latch output signal is inverted is input to the gate of N-type transistor 906. Thus, P-type transistor 905 and N-type transistor 906 form transfer gate 907 located between reference voltage generation circuit 910 and input initial stage circuit 701.

Reference voltage generation circuit 910 supplies a third voltage that is greater than reference voltage Vref by 100 mV (referred to as reference voltage Vref1) to transfer gate 904 and supplies a fourth voltage that is smaller than reference voltage Vref by 100 mV (referred to as reference voltage Vref2) to transfer gate 907.

Figure 10:
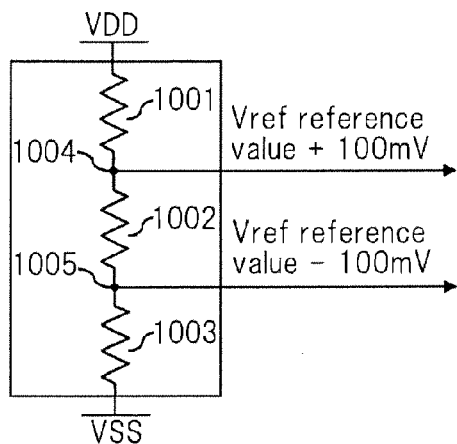
FIG. 10 is a circuit diagram showing the structure of a reference voltage generation circuit shown in FIG. 9.

To cause reference voltage generation circuit 910 to output reference voltages Vref1 and Vref2, for example, resistors 1001, 1002, and 1003 are connected in series between power supply line VDD and power supply line VSS as shown in FIG. 10.

The voltage of connection node 1004 between resistor 1001 and resistor 1002 depends on the resistance value of resistor 1001 located on the power supply voltage VDD side viewed from connection node 1004 and the resistance values of resistor 1002 and resistor 1003 located on the power supply line VSS side viewed from connection node 1004. On the other hand, the voltage of connection node 1005 between resistor 1002 and resistor 1003 depends on the resistance values of resistors 1001 and 1002 located on the power supply line VDD side viewed from connection node 1005 and the resistance value of resistor 1003 located on the power supply line VSS side viewed from connection node 1005. Thus, resistors 1001, 1002, and 1003 are adjusted such that the voltage of connection node 1004 enters greater than reference voltage Vref by 100 mV and the voltage of connection node 1005 enters smaller than reference voltage Vref by 100 mA.

Next, the operations of individual sections of reference voltage switching circuit 702 corresponding to the logic level of the latch output signal will be described.

When the latch output signal whose logic level is the high level is input to reference voltage switching circuit 702, transfer gate 904 enters the on state and transfer gate 907 enters the off state.

When transfer gate 904 enters the on state and transfer gate 907 enters the off state, reference voltage Verf1 is supplied to N-type transistor 803. If the drive voltage is 1.2 V, reference voltage Vref enters for example its intermediate voltage, 0.6 V. In this case, reference voltage Vref1 enters 0.7 V.

In contrast, when the latch output signal whose logic level is the low level is input to reference voltage switching circuit 702, transfer gate 904 enters the off state and transfer gate 907 enters the on state.

When transfer gate 904 enters the off state and transfer gate 907 enters the on state, reference voltage Vref2 is supplied to N-type transistor 803. If reference voltage Vref is 0.6 V, reference voltage Vref2 enters 0.5 V.

Thus, reference voltage switching circuit 702 increases or decreases reference voltage Vref corresponding to the logic level of the latch output signal.

Next, the operations of input initial stage circuit 701, latch circuit 103, and reference voltage switching circuit 702 will be specifically described.

In the following description, it is assumed that an input signal whose logic level is the high level is input.

When an input signal whose logic level is the high level is input, input initial stage circuit 701 outputs an initial stage output signal whose logic level is the low level to latch circuit 103.

As described above, since the logic level of the pre-latch signal is the same as the logic level of the initial stage output signal, the logic level of the pre-latch signal is the low level. When the logic level of the pre-latch signal is the low level, latch circuit 103 outputs the latch output signal whose logic level is the high level to reference voltage switching circuit 702.

As described above, when the latch output signal whose logic level is the high level is input, reference voltage switching circuit 702 inputs reference voltage Vref1 to N-type transistor 803.

It is assumed that while reference voltage Vref1 is input to N-type transistor 803, an input signal whose logic level is the high level is followed by an input signal whose logic level is the low level.

In input initial stage circuit 701, the output swing valid region is proportional to the difference between the voltage of the input signal and the reference voltage. Thus, if the logic level of the input signal is the low level, when reference voltage Vref1 that is greater than reference voltage Vref by 100 mV is input to N-type transistor 803, the output swing valid region enters larger and thereby a signal having a larger amplitude can be output than when reference voltage Vref is input to N-type transistor 803. When reference voltage Vref1 is input to N-type transistor 803, a larger current can flow in N-type transistor 804 than when reference voltage Vref is input to N-type transistor 803. Thus, since an input signal whose logic level is the high level has been input last time, output line Output that is in the low level is charged and enters the high level (drive voltage) corresponding to the charging competence (current drive competence) of P-type transistor 802, output line Output can output the signal at a high speed.

Next, it is assumed that while reference voltage Vref1 is input to N-type transistor 803, an input signal whose logic level is the high level is followed by an input signal whose logic level is the high level.

If the logic level of the input signal that has been input last time is the same as the logic level of the input signal that is input this time, the logic levels of the initial stage output signal, the pre-latch signal, the latch output, the latch data, and the latch output signal are the same as those of the signals that have been input last time. Thus, the initial stage circuit does not need to output a signal with a high speed response.

Thus, when the logic level of the input signal that has been input last time is the high level and reference voltage is decreased from reference voltage Vref, the signal output characteristics, in which the logic level of the input signal that is input next time is inverted, can be improved.

In the foregoing example, the case in which an input signal whose logic level is the high level is followed by an input signal whose logic level is the low level and the case in which an input signal whose logic level is the high level is followed by an input signal whose logic level is the high level were described. In these cases, reference voltage Vref1 that is greater than reference voltage Vref is input to the gate of N-type transistor 803 and thereby the signal output characteristics, in which the logic level of the input signal that is input next time is inverted, can be improved.

Next, the case in which an input signal whose logic level is the low level is followed by an input signal whose logic level is the high level and the case in which an input signal whose logic level is the low level is followed by an input signal whose logic level is the low level will be described.

When an input signal whose logic level is the low level is input to input initial stage circuit 701, it outputs an initial stage output signal whose logic level is the high level to latch circuit 103.

As describe above, since the logic level of the pre-latch signal is the same as the logic level of the initial stage output signal, the logic level of the pre-latch signal is the high level. When the logic level of the pre-latch signal is the high level, latch circuit 103 outputs the latch output signal whose logic level is the low level to reference voltage switching circuit 702 and subsequent circuit 106.

When the latch output signal whose logic level is the low level is input to reference voltage switching circuit 702, reference voltage switching circuit 702 inputs reference voltage Vref2 to N-type transistor 803 as described above.

It is assumed that while reference voltage Vref2 is input to N-type transistor 803, an input signal whose logic level is the low level is followed by an input signal whose logic level is the high level.

As describe above, in input initial stage circuit 701, the output swing valid region is proportional to the difference between the voltage of the input signal and the reference voltage. Thus, if the logic level of the input signal is the high level, when reference voltage Vref2 that is smaller than when reference voltage Vref by 100 mV is input to N-type transistor 803, the output swing valid region becomes larger and a signal having a larger amplitude can be output than when reference voltage Vref is input to N-type transistor 803. When reference voltage Vref2 is input to N-type transistor 803, a smaller current flows in N-type transistor 804 that is in the on state than when reference voltage Vref is input to N-type transistor 803. Thus, since the input signal whose logic level is the low level has been input last time and thereby output line Output is in the high level, N-type transistor 804 draws electric charges in the low level (ground voltage) from output line Output corresponding to the competence that N-type transistor 804 draws electric charge, output line Output can output the signal at a high speed.

In contrast, it is assumed that while reference voltage Vref2 is input to N-type transistor 803, an input signal whose logic level is the low level is followed by an input signal whose logic level is the low level.

When the logic level of the input signal that has been input last time is the same as the logic level that is input this time, the logic levels of the initial stage output signal, the pre-latch signal, the latch output, the latch data, and the latch output signal are the same as those of the signals that have been input last time. Thus, initial stage circuit does not need to output a signal with high speed response.

Thus, when the logic level of the input signal that has been input last time is the low level and reference voltage is decreased from reference voltage Vref, the output characteristics of the signal, in which the logic level of the input signal that has been input last time, can be improved.

Thus, according to this embodiment, input signal reception circuit 700 has one differential circuit that outputs a signal in which the logic level of the input signal is inverted and adjusts reference voltage Vref such that the signal output characteristics, in which the logic level of the next input signal is inverted, are improved corresponding to the logic level of the input signal that has been input last time.

Thus, the input signal can be accurately received. In addition, the circuit structure of input signal reception circuit 700 according to this embodiment can be decreased compared with the input signal reception circuit that always drives two differential circuits that differ in output characteristics that depend on the logic level of the input signal. In addition, input signal reception circuit 700 according to this embodiment can reduce the power consumption.

According to the foregoing first and second exemplary embodiments, rise dominant initial stage circuit 101 or fall dominant initial stage circuit 102 is caused to enter the active state or reference voltage Vref is increased or decreased corresponding to the logic level of the input signal that has been input last time. However, in the initial state of the input signal reception circuit, the logic level of the input signal has not been decided. This situation can be handled in various manners.

For example, the logic level of the input signal that is input first time may be pre-decided. In this method, the logic level of the input signal that is input first time is pre-decided. Thus, rise dominant initial stage circuit 101 or fall dominant initial stage circuit 102 that has higher output characteristics of the signal in which the logic level is inverted is caused to enters the active state corresponding to the pre-decided logic level or the reference voltage is increased or decreased so as to improve the output characteristics of the signal of input initial stage circuit 701.

Alternatively, in the initial state, an initial value may be set to latch circuit 103.

Figure 2:
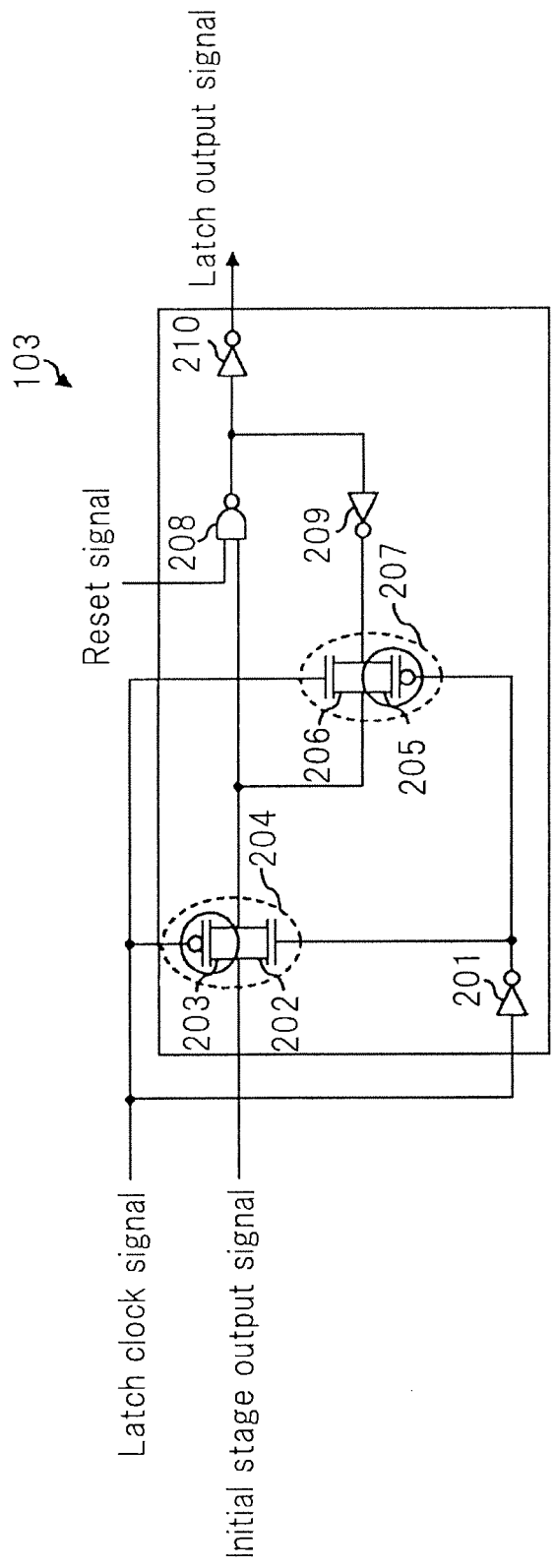
FIG. 2 is a circuit diagram showing the structure of a latch circuit shown in FIG. 1.

In the initial state, when the reset signal whose logic level is the low level is input to NAND circuit 208 shown in FIG. 2, the logic level of the latch output enters the low level and the logic level of the latch output signal enters the high level. In input signal reception circuit 100 according to the first embodiment, when the logic level of the latch output signal enters the high level, fall dominant initial stage circuit 102 enters the active state. By contrast, in input signal reception circuit 700 according to the second embodiment, when the logic level of the latch output signal enters the high level, reference voltage Vref2 that is smaller than reference voltage Vref by 100 mV is input to input initial stage circuit 701.

Figure 11:
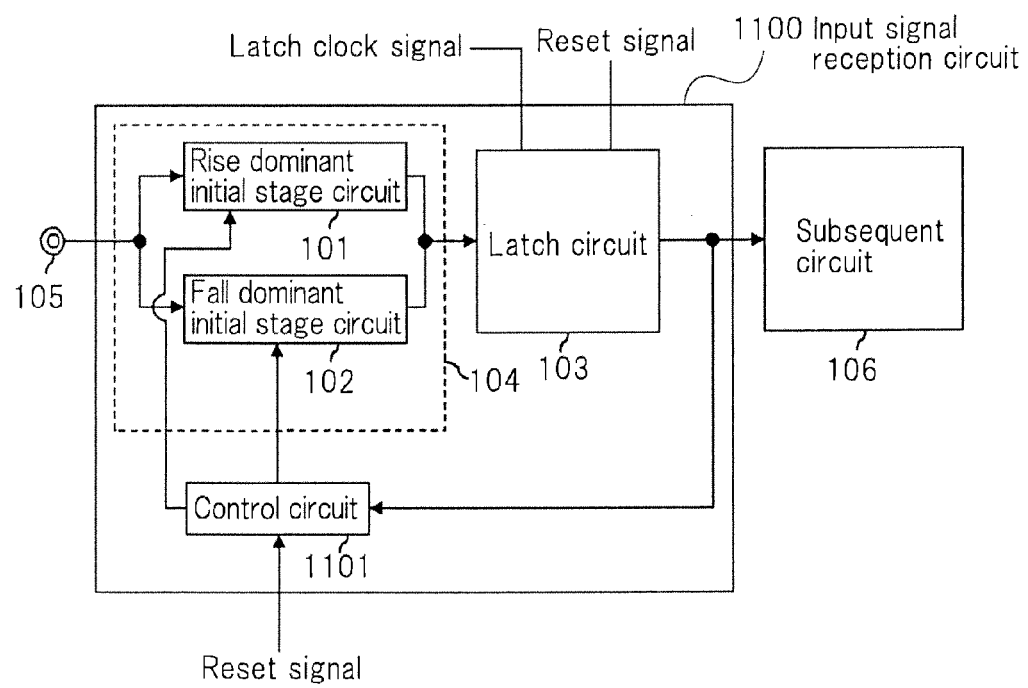
FIG. 11 is a block diagram showing another structure of the input signal reception circuit according to the first exemplary embodiment of the present invention.

When the latch output signal whose logic level is the high level is input to subsequent circuit 106, subsequent circuit 106 may malfunction. Thus, the logic level of the latch output signal needs to be the low level such that subsequent circuit 106 does not malfunction. In the circuit shown in FIG. 2, to do that, an NOR circuit is used instead of NAND circuit 208. The reset signal is inverted and then the inverted signal is input to the NOR circuit. Alternatively, in input signal reception circuit 100 according to the first embodiment, both rise dominant initial stage circuit 101 and fall dominant initial stage circuit 102 may be caused to enter the active state. FIG. 11 is a block diagram showing the structure of input signal reception circuit 1100 according to this method.

Input signal reception circuit 1100 according to this method is different from input signal reception circuit 100 according to the first embodiment in that control circuit 1101 is added and in that the latch output signal is input to control circuit 1101.

The reset signal is input to control circuit 1101.

In the normal state, control circuit 1101 outputs a control signal to rise dominant initial stage circuit 101 and fall dominant initial stage circuit 102 so as to cause rise dominant initial stage circuit 101 or fall dominant initial stage circuit 102 to enter the active state and the other to enter the inactive state corresponding to the logic level of the latch output signal. In the initial state, when the reset signal whose logic level is the low level is input to control circuit 1101, control circuit 1101 outputs a control signal that causes both rise dominant initial stage circuit 101 and fall dominant initial stage circuit 102 to enter the active state.

When an input signal is initially input to input signal reception circuit 1100, rise dominant initial stage circuit 101 and fall dominant initial stage circuit 102 output a signal in which the logic level of the input signal is inverted (initial stage output signal). Latch data are latched by latch circuit 103 corresponding to the initial stage output signal and thereby a latch output signal is uniquely decided. Thereafter, only rise dominant initial stage circuit 101 or fall dominant initial stage circuit 102 enters the active state.

Figure 13:
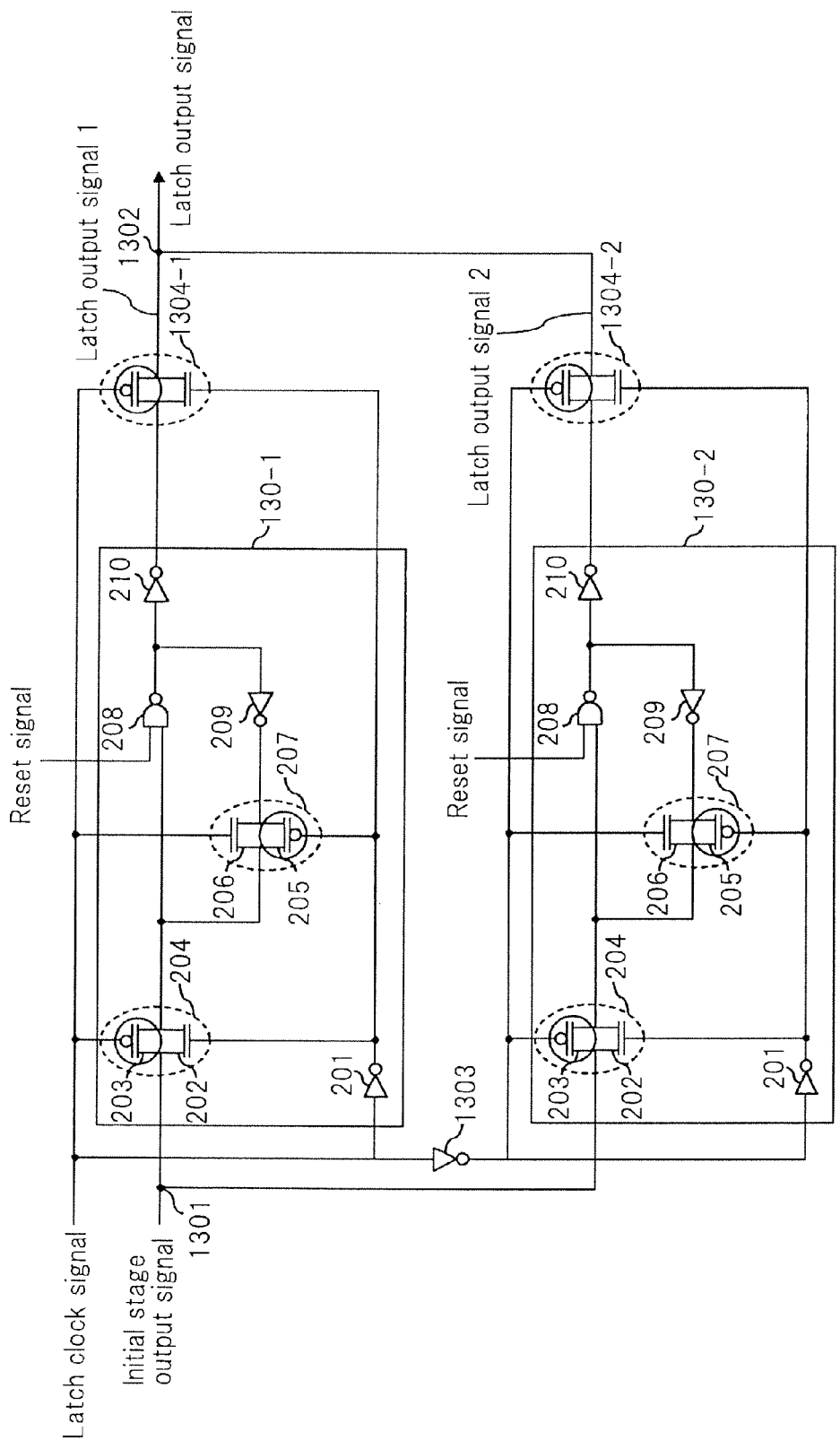
FIG. 13 is a circuit diagram showing a modification of the input signal reception circuit according to the present invention.

According to the foregoing embodiments, only fall edges of the latch clock signal are used. Thus, the foregoing embodiments cannot be applied to a semiconductor device that performs the so-called DDR (Double Data Rate) using both fall edges and rise edges for memory. FIG. 13 shows a modification corresponding to the DDR operation.

According to this modification, latch circuits 103-1 and 103-2 are located in parallel between input node 1301 of the initial stage output signal and output node 1302 of the latch output signal. Latch clock signal T is input to latch circuit 103-1, whereas latch clock signal B in which the logic level of latch clock signal T is inverted by inverter 1303 is input to latch circuit 103-2. The structure of each of latch circuits 103-1 and 103-2 is the same as that of latch circuit 103 shown in FIG. 2.

Transfer gates 1304-1 and 1304-2 that complementarily operate are located between each of latch circuits 103-1 and 103-2 and output node 1302 such that latch output signal 1 that is output from latch circuit 103-1 does not contend with latch output signal 2 that is output from latch circuit 103-2. Inverter 210 of each of latch circuits 103-1 and 103-2 may be made up of a clocked inverter that complementarily operates corresponding to the latch clock signal.

Next, with reference to FIG. 14, the operation of the modification corresponding to the DDR operation will be described.

In the modification corresponding to the DDR operation, latch circuits 103-1 and 103-2 are controlled corresponding to latch clock signal T and latch clock signal B.

Latch clock signal T and latch clock signal B correspond to high pulses of clock signals CK/CKB, respectively. Thus, with two latch circuits 103-1 and 103-2, one value is latched every half period (two values every one period).

In addition, transfer gates 1304-1 and 1304-2 are controlled corresponding to latch clock signal T and latch clock signal B, respectively. Latch output signal 1 and 2 enter the high impedance state (Hi-z). Thus, no bus conflict occurs between latch output signals. As a result, latch output signals 1 and 2 correspond to high pulses of clock signals CK/CKB. Thus, data are output every half period and combined on the latch clock node.

Figure 14:
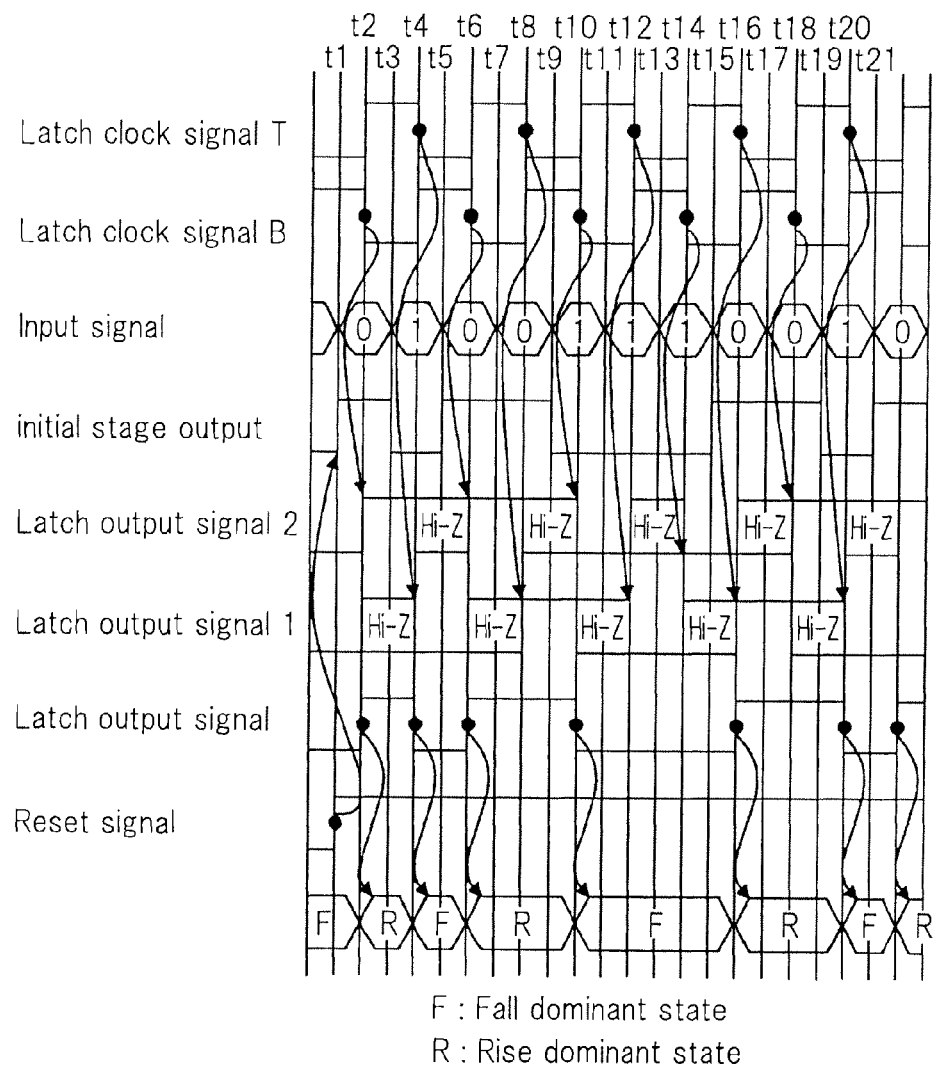
FIG. 14 is a timing chart showing the operation of the input signal reception circuit shown in FIG. 13.

According to the modification corresponding to the DDR operation, as shown in FIG. 14, at time t1, the reset signal is deactivated and thereby the logic level of the initial stage output enters the high level.

Since the logic level of latch clock signal T is the low level and the logic level of latch clock signal B is the high level, only latch circuit 103-1 accepts an input signal and outputs a latch output signal. In contrast, since the logic level of latch clock signal B is the high level, latch circuit 103-2 shuts out an input signal and its output enters the high impedance state (Hi-z).

At this point, in input initial stage circuit 104, since the logic level of latch output signal 1 is the low level, fall dominant initial stage circuit 102 enters the active state and rise dominant initial stage circuit 101 enters the inactive state and thereby the fall dominant state occurs.

At time t2, the initial stage output signal whose logic level enters the high level is latched by latch circuit 103-2 corresponding to input signal (0) whose logic level is the low level at a fall edge of latch clock signal B and thereby the logic level of latch output signal 2 enters the high level. Since the output of latch circuit 103-2 is the high impedance state (Hi-z), no bus conflict occurs between latch output signal 1 and latch output signal 2.

In input initial stage circuit 104, when latch output signal 2 enters the high level, fall dominant initial stage circuit 102 enters the inactive state and rise dominant initial stage circuit 101 enters the active state and thereby the rise dominant state occurs.

At time t3, although rise dominant initial stage circuit 101 enters the active state corresponding to the input signal whose logic level is the high level, since the logic level of latch clock signal T is the high level, latch circuit 103-1 shuts out an input signal and its output enters the high impedance state (Hi-z). In contrast, since the logic level of latch clock signal B is the low level, latch circuit 103-2 inputs the initial stage output signal and outputs latch output signal 2. Likewise, since latch output signal 1 is in the high impedance state (Hi-z), no bus conflict occurs between latch output signal 1 and latch output signal 2.

At time t4 or later, the initial stage output signal that varies corresponding to the logic level of the input signal is latched by latch circuits 103-1 and 103-2 at fall edges of latch clock signal T and latch clock signal B and thereby the switching operation between the fall dominant state and the rise dominant state is repeated.

In each of the foregoing embodiments, the initial stage output signal is latched at fall edges of the latch clock signal. Alternatively, the initial stage output signal may be latched at rise edges of the latch clock signal.

Moreover, in each of the foregoing embodiments, the input initial stage circuit was an input circuit that inputs a signal from the outside of the semiconductor device. Alternatively, the input initial stage circuit may be an input circuit that inputs a signal to the semiconductor device.

This application is based upon and claims the benefit of priority from the prior Japanese Application No. 2012-67568 filed on Mar. 3, 2012, the entire contents of which are incorporated herein by reference.

It is apparent that the present invention is not limited to the above embodiments, but may be modified and changed without departing from the scope and spirit of the invention.

The invention claimed is:

1. A semiconductor device comprising:
an input circuit that is connected between an input node and an output node and that changes a level of said output node corresponding to a signal supplied to said input node,
wherein when a control signal represents a first mode, a speed at which said input circuit changes the level of said output node from a first level to a second level is greater than a speed at which said input circuit changes the level of said output node from said second level to said first level and when said control signal represents a second mode that is different from said first mode, the speed at which said input circuit changes the level of said output node from said second level to said first level is greater than the speed at which said input circuit changes the level of said output node from said first level to said second level.

2. The semiconductor device according to claim 1, wherein said input circuit has a differential amplification circuit.

3. The semiconductor device according to claim 2, wherein said differential amplification circuit has two terminals, one terminal being connected to said input node, a reference voltage being supplied to the other terminal.

4. The semiconductor device according to claim 1, wherein said input circuit has a first circuit and a second circuit that are connected between said input node and said output node, said first input circuit entering an active state when said control signal represents said first mode and entering an inactive state when said control signal represents said second mode, said second input circuit entering an inactive state when said control signal represents said second mode and entering an active state when said control signal represents said first mode.

5. The semiconductor device according to claim 3, further comprising:
a reference voltage switching circuit that switches between two values of a reference voltage supplied to said differential amplification circuit depending on whether said control signal represents said first mode or said second mode.

6. The semiconductor device according to claim 1, further comprising:
a latch circuit that latches data that are output corresponding to input data that are input to said input circuit and then generates said control signal.

7. An input signal reception circuit that inputs an input signal that has a first logic level or a second logic level and outputs a signal corresponding to the logic level of said input signal to a subsequent circuit, comprising:
a first differential circuit that outputs a signal in which the logic level of said input signal is inverted, and in which output characteristics of said signal, when the logic level of said input signal is said first logic level, are superior to output characteristics of said signal when the logic level of said input signal is said second logic level;
a second differential circuit that outputs a signal in which the logic level of said input signal is inverted, and in which output characteristics of said signal when the logic level of said input signal is said second logic level are superior to output characteristics of said signal when the logic level of said input signal is said first logic level; and
a control section that causes one of said first and second differential circuits to enter the active state and the other to enter the inactive state,
wherein said control section holds the logic level of the signal that is output from said first differential circuit or from said second differential circuit corresponding to the input signal that has been input last time, outputs a signal corresponding to the held logic level to said subsequent circuit, and causes said first differential circuit or said second differential circuit to enter the active state corresponding to the logic level of the input signal that has been input last time.

8. The input signal reception circuit according to claim 7, wherein said control section causes said second differential circuit to enter the active state when the logic level of the input signal that has been input last time is said first logic level and causes said first differential circuit to enter the active state when the logic level of the input signal that has been input last time is said second logic level.

9. An input signal reception circuit that inputs an input signal that has a first logic level or a second logic level and outputs a signal corresponding to the logic level of said input signal to a subsequent circuit, comprising:
a differential circuit that outputs a signal in which the logic level of said input signal is inverted corresponding to the difference between a reference voltage and a voltage of said input signal;
a switching circuit that switches values of said reference voltage; and
a control section that holds the logic level of said signal that is output from said differential circuit corresponding to the input signal that has been input last time, outputs a signal corresponding to the held logic level to said subsequent circuit, and inputs a signal that denotes that said reference voltage is increased or decreased corresponding to the logic level of the input signal that has been input last time to said switching circuit.

10. The input signal reception circuit according to claim 9, wherein said control section causes said reference voltage to be a third voltage value when the logic level of the input signal that has been input last time is said first logic level corresponding to a first voltage and causes said reference voltage to be a fourth voltage that is lower than said third voltage when the logic level of the input signal that has been input last time is said second logic level corresponding to a second voltage that is lower than said first voltage.

11. The input signal reception circuit according to claim 7, wherein said control section initially causes said first and second differential circuits to enter the active state.

12. The input signal reception circuit according to claim 7, wherein said control section initially causes the logic level of the input signal that has been input last time to be said first logic level or said second logic level.

* * * * *